United States Patent
Rose et al.

(10) Patent No.: US 10,027,299 B2
(45) Date of Patent: Jul. 17, 2018

(54) VOLUME CONTROL

(71) Applicant: Lenovo (Singapore) Pte. Ltd., Singapore (SG)

(72) Inventors: Amy Leigh Rose, Chapel Hill, NC (US); Nathan J. Peterson, Durham, NC (US); Jennifer J. Lee-Baron, Morrisville, NC (US); John Scott Crowe, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 353 days.

(21) Appl. No.: 14/468,314

(22) Filed: Aug. 25, 2014

(65) Prior Publication Data

US 2016/0056781 A1 Feb. 25, 2016

(51) Int. Cl.
*H03G 3/00* (2006.01)
*H03G 3/02* (2006.01)
*G06F 3/16* (2006.01)
*H03G 3/32* (2006.01)

(52) U.S. Cl.
CPC ............. *H03G 3/02* (2013.01); *G06F 3/165* (2013.01); *H03G 3/32* (2013.01)

(58) Field of Classification Search
CPC ...... H04R 25/70; H04R 25/50; H04R 1/1058; H04R 25/552; H04R 25/606; H04R 29/008; H04R 1/086; H04R 2225/61; H04R 2410/07; H04R 5/02; H04R 2420/07; H04R 25/00; H04R 25/30; H04M 1/6008; H04M 1/656; H04M 1/7255; H04M 1/6016; H04M 1/6066; H04M 1/725; H04M 2250/02; H04M 9/082; H04H 60/04; H04N 21/439; H04N 1/00132; H04N 5/222; H04N 5/765; H04N 9/8042; H04N 9/80
USPC ............... 381/102–106, 92, 56–58, 111, 91; 700/94
See application file for complete search history.

(56) References Cited

U.S. PATENT DOCUMENTS

| | | | | |
|---|---|---|---|---|
| 4,628,530 A * | 12/1986 | Op De Beek | .......... | H03G 5/165 381/103 |
| 4,879,751 A * | 11/1989 | Franks | .................... | H04H 60/04 381/109 |
| 5,506,910 A * | 4/1996 | Miller | ...................... | H03G 3/32 381/103 |
| 8,896,765 B1 * | 11/2014 | White | .................. | H04N 5/4403 348/734 |
| 2012/0032891 A1 * | 2/2012 | Parivar | ............... | G06F 3/04883 345/173 |
| 2012/0105358 A1 * | 5/2012 | Momeyer | ............. | G06F 3/0414 345/174 |
| 2015/0378546 A1 * | 12/2015 | Osborne | ............. | G06F 3/04847 715/833 |

* cited by examiner

*Primary Examiner* — Lun-See Lao
(74) *Attorney, Agent, or Firm* — Brian J. Pangrle (57) ABSTRACT

An apparatus can include a processor; memory accessible by the processor; a microphone; an audio signal output; audio circuitry that renders audio signals to the audio signal output; and volume control circuitry that regulates coarseness of increments of a dynamic range of the audio signals responsive to input via the microphone.

20 Claims, 9 Drawing Sheets

| Perceptions of Increase in Decibel Level 610 | |
|---|---|
| Possibly Imperceptible Change* | 1 dB |
| Barely Perceptible Change | 3 dB |
| Clearly Noticeable Change | 5 dB |
| About Twice as Load | 10 dB |
| About Four Times as Loud | 20 dB |

* Depending on hearing of an individual

| Environmental Noise 620 | |
|---|---|
| Weakest Sound Heard* | 0 dB |
| Whisper Quiet Library at 6 Feet | 30 dB |
| Normal Conversation at 3 Feet | 60 to 65 dB |
| Telephone Dial Tone | 80 dB |

* Example of possible reference sound level

FIG. 6

| Ambient Noise Level 710 | Granularity 720 |
|---|---|
| 0 to 10 dB | 2 dB |
| 11 to 20 dB | 2.5 dB |
| 21 to 30 dB | 3 dB |
| 31 to 40 dB | 3.5 dB |
| 41 to 50 dB | 4 dB |
| 51 to 60 dB | 5 dB |
| 61 to 70 dB | 6 dB |
| 71 to 80 dB | 6 dB |

VOLUME CONTROL

TECHNICAL FIELD

Subject matter disclosed herein generally relates to volume control.

BACKGROUND

Various types of devices include a volume control that allows a user to adjust audio volume.

SUMMARY

An apparatus can include a processor; memory accessible by the processor; a microphone; an audio signal output; audio circuitry that renders audio signals to the audio signal output; and volume control circuitry that regulates coarseness of increments of a dynamic range of the audio signals responsive to input via the microphone. Various other apparatuses, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

A device that can render audio may have a volume control with fixed granularity (e.g., fixed increment or increments). When a room is very quiet and a user wants to adjust a volume level of such a device (e.g., adjusting from level 2 to level 1), the incremental change in the volume of a volume control may be too loud and the next one down may be too quiet or even silenced. If the granularity of the incremental volume control volume levels was increased (finer increments), the user would have to actuate the volume control (e.g., button, etc.) too many times to change the volume level of the device by a large amount.

As an example, a device can include an adjustable volume control granularity where an adjust may be based at least in part on sensed information such as, for example, sensed ambient noise. For example, a device may include a microphone that can sense ambient noise and that can adjust volume control granularity based at least in part on sensed ambient noise. Such a device may optionally operate in automatically, for example, by sensing ambient noise and automatically adjusting one or more volume control parameters based at least in part on a portion of the sensed ambient noise. As an example, when it is noisy outside, a user may not hear many differences between volume levels and so does not need fine granularity to control volume to an acceptable, desired volume level. However, if it is silent in a room, smaller changes can make a bigger difference as to user perception. In this latter instance, a device can determine that a room is relatively silent (e.g., lacking in ambient, audible noise) and increase granularity of increments of a volume control (finer increments) in a manner that allows a user to select from a larger number of volume levels within a volume range (e.g., dynamic range). As an example, a device can increase granularity of levels of a volume control (finer levels) when there is less ambient noise.

Figure 1:
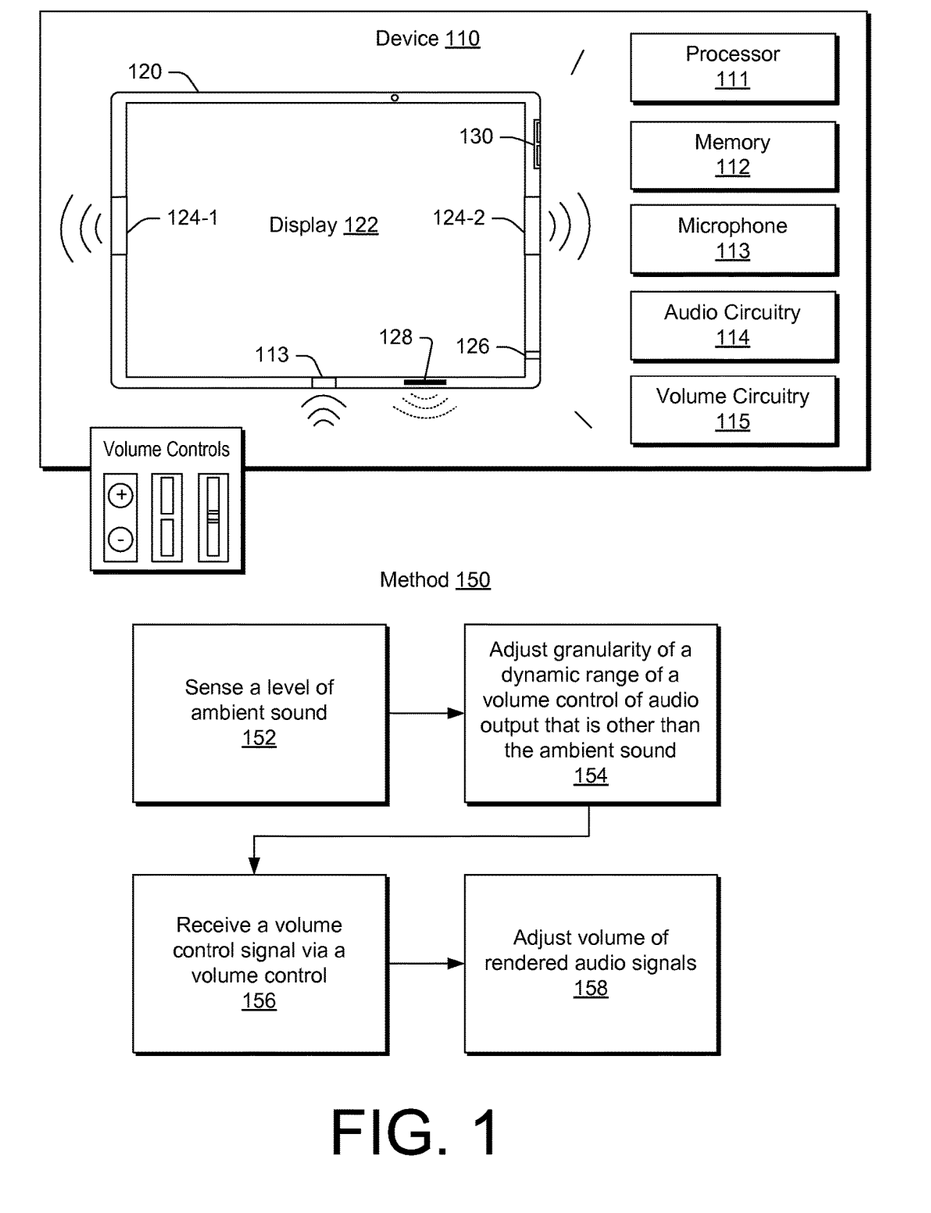
FIG. 1 is a series of diagrams of an example of a device, an example of a method and examples of volume controls.

FIG. 1 shows an example of a device 110 and an example of a method 150. As shown, the device 110 includes a processor 111; memory 112 accessible by the processor 111; a microphone 113; an audio signal output 124-1, 124-2, 126 and/or 128; audio circuitry 114 that renders audio signals to the audio signal output 124-1, 124-2, 126 and/or 128; and volume control circuitry 115 that regulates coarseness of increments of a dynamic range of the audio signals responsive to input via the microphone 113.

In the example of FIG. 1, the device 110 also includes a housing 120 and a display 122 as well as a volume control 130, which may be one or more touch-sensitive buttons. For example, the volume control 130 may be depressible buttons, capacitive buttons, a rocker button, etc. FIG. 1 shows some examples of touch-sensitive volume controls that include a two button volume control where the buttons are cylindrical, a two button volume control where the buttons are elongated and a rocker volume control, which may pivot about a pivot point or pivot axis. In such examples, the volume controls may optionally be depressible in that application of force with a finger may cause movement (e.g., displacement). As an example, a volume control may operative via touch-sensing circuitry. For example, a volume control may be operative via capacitive touch-sensing circuitry where movement of a component may not occur for issuance of a signal, command, instruction, etc. for changing a volume level.

As an example, for a touch-sensitive volume control that include a positive increment touch surface and a negative increment touch surface, a single touch may correspond to a single increment change. As an example, two successive touches to a touch surface may correspond to two increments of change, three successive touches to a touch surface may correspond to three increments of change, etc.

As to audio signal output, the outputs 124-1 and 124-2 may be speakers such as two mono speakers, two stereo speakers, or other multiphonic speakers. The output 126 may be a plug output such as, for example, a line jack, a headphone jack, etc. The output 128 may be a wireless output (e.g., antenna, etc.) such as, for example, a BLUETOOTH® interface, a WiFi interface, etc.

As an example, the device 110 may sense information via the microphone 113 and adjust granularity of the volume control 130 based at least in part on the sensed information.

For example, where the microphone 113 senses ambient noise that is classified as low level ambient noise (e.g., less than about 30 dB), the device 110 may increase the granularity of the volume control 130 (e.g., from about 5 dB or more to less than about 5 dB). In such an example, a user may touch the volume control 130 an appropriate number of times to thereby select a volume level for one or more of the audio outputs 124-1, 124-2, 126 and 128.

In the example of FIG. 1, the method 150 includes a sense block 152 for sensing a level of ambient sound; and an adjustment block 154 for, responsive to the sensing, adjusting granularity of a dynamic range of a volume control of audio output that is other than the ambient sound. In such an example, the method 150 may include a reception block 156 for receiving a volume control signal via a volume control and, for example, an adjustment block 158 for adjusting volume of rendered audio signals.

As an example, the device 110 may implement a method such as the method 150. For example, the microphone 113 may sense a level of ambient sound and the volume circuitry 115 may adjust granularity of a dynamic range of the volume control 130 for audio output by one or more of the audio outputs 124-1, 124-2, 126 and 128 where the audio output is other than the ambient sound.

Figure 2:
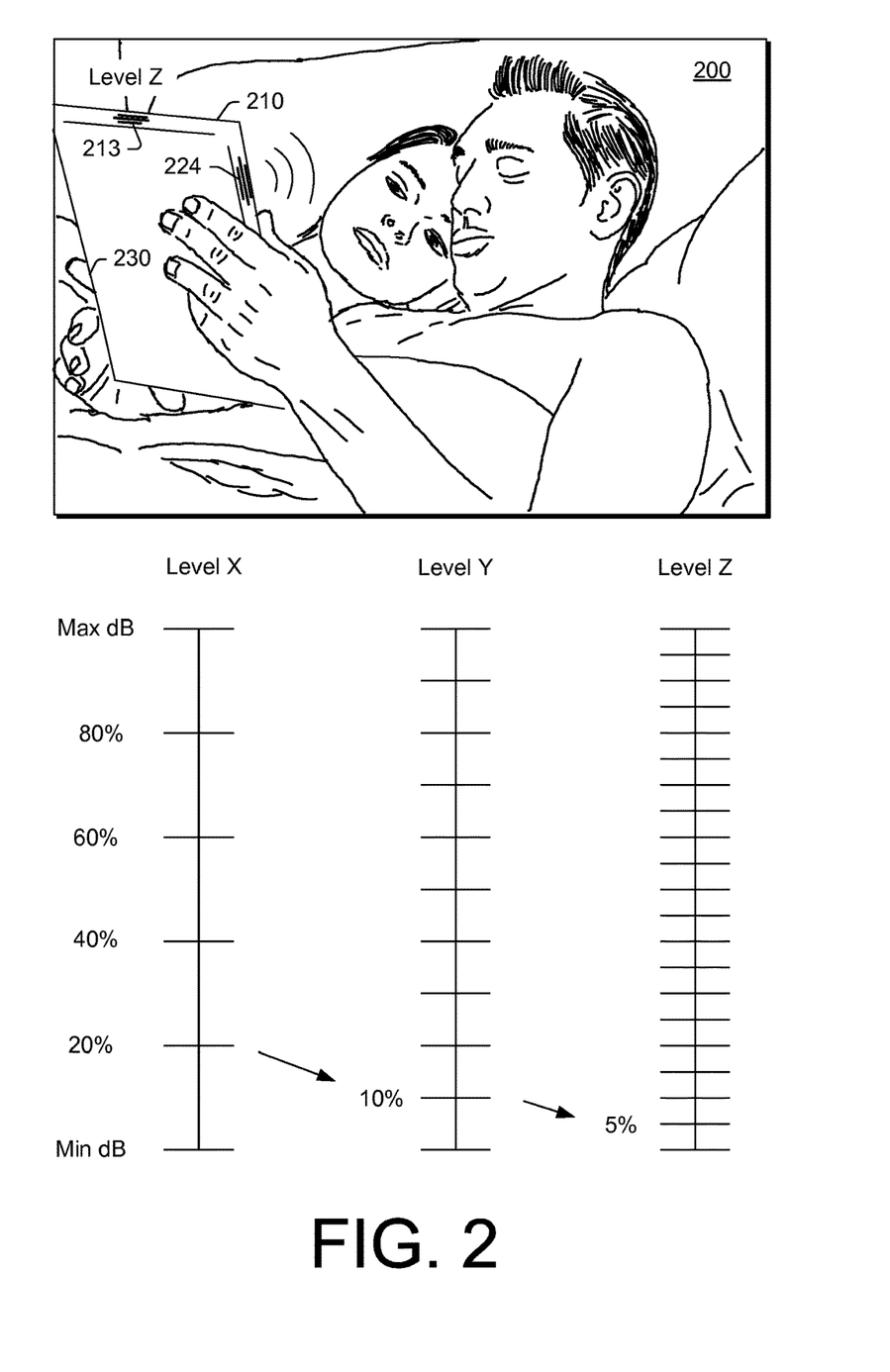
FIG. 2 is a series of diagrams of an example of a scenario and examples of granularities as to volume for different levels of ambient sound.

FIG. 2 shows an example of a scenario 200 in an environment where two people are lying down in bed while listening to audio being rendered by a device 210. As shown, the device includes a microphone 213, a speaker 224 and a volume control 230. In the example of FIG. 2, the device 210 may sense via the microphone 213 a level of ambient sound, represented as "Level Z".

In the example of FIG. 2, the device 210 may sample sound in the environment via the microphone 213 and determining a level of ambient sound based at least in part on one or more of the samples. For example, the device 210 may determine a minimum sound level for a series of samples where the minimum sound level represents a level of ambient sound. Such a minimum sound level may optionally be determined in the presence of audio being rendered via the speaker 224. For example, if the audio is voice, pauses in the voice may result in sensing of ambient sound. As another example, if the audio is music, pauses in the music may result in sensing of ambient sound (e.g., between songs, between movements, pauses or gaps of near silence in a song, etc.). As another example, where a user navigates media, sensing of sound during gaps between rendering of media may be indicative of ambient sound. As an example, a device may include sensing a level of ambient sound prior to rendering audio. For example, where a user selects a "play" button to render media that is or that includes audio, a device may sample sound via a microphone or microphones prior to rendering of the media. In such an example, a small sampling delay may be of the order of a second to a few seconds before rendering of the media occurs. As an example, a device may include sensing sound over a period of time and then analyzing the sound for patterns, minima, etc. to determine a level of ambient sound.

In the example of FIG. 2, granularity is shown for three decreasing levels of ambient sound: Level X, Level Y and Level Z. The granularity is shown with respect to a dynamic range from a minimum dB level to a maximum dB level. For Level X, granularity is at 20 percent increments; for Level Y, granularity is at 10 percent increments; and for Level Z, granularity is at 5 percent increments. As an example, an increment may be linear, logarithmic or of another form. For example, while percent increments are shown in the example of FIG. 2, a logarithmic increment may be implemented (e.g., optionally expressed in dB, etc.; see, e.g., FIG. 6).

As an example, granularity may be adjusted for a portion of a dynamic range. For example, for Level Z as compared to Level Y, granularity may be increased for a portion of the dynamic range from about the minimum dB level to about the 40 percent dB level. Such an approach may be implemented where a user may be expected to listen to audio in a low ambient sound level environment at a rendered level that is no more than about 40 percent of a dynamic range. For example, a portion of a dynamic range for which granularity is to be increased may be a diminishing portion that diminishes with diminishing level of ambient noise.

Figure 3:
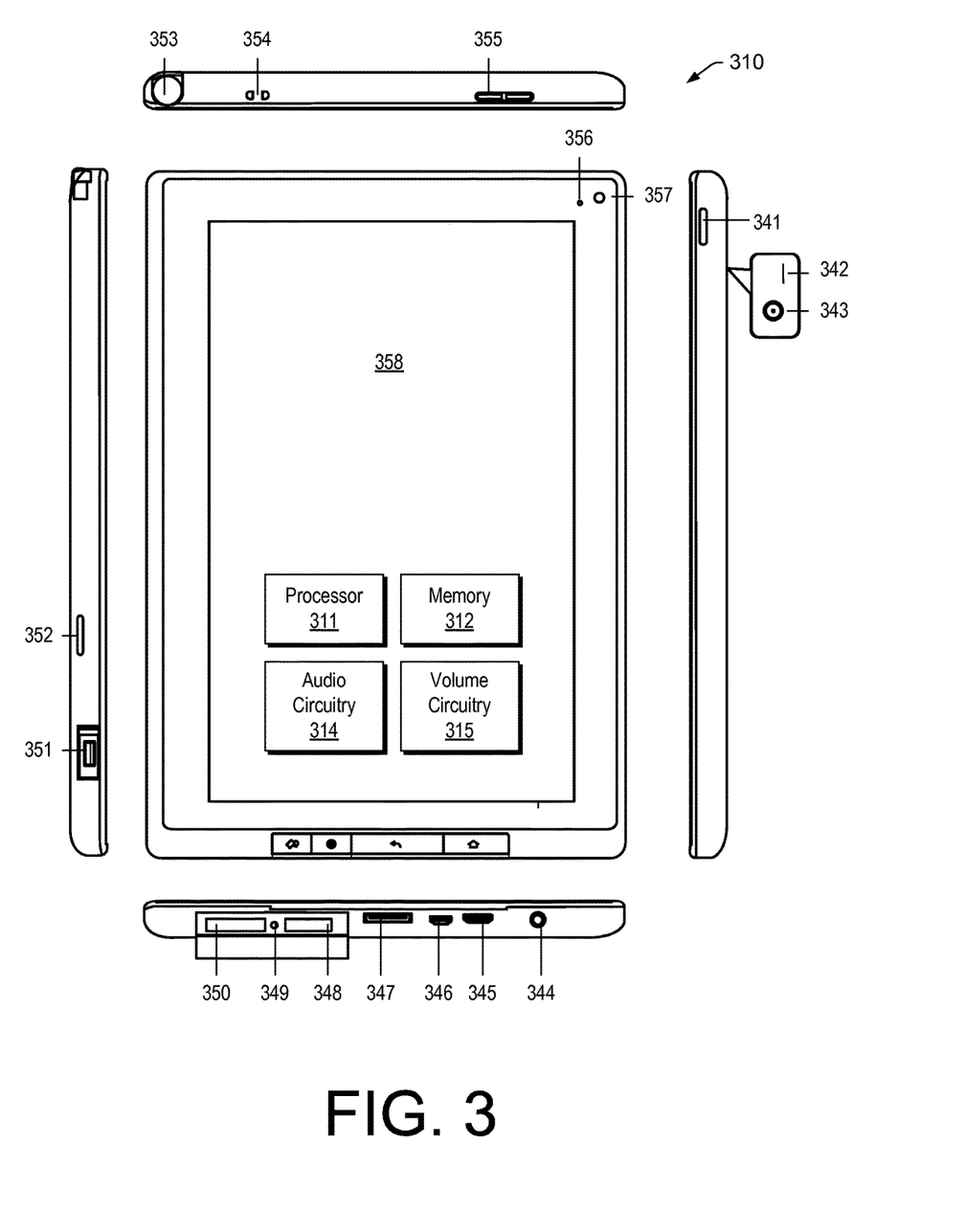
FIG. 3 is a diagram of an example of a device.

FIG. 3 shows an example of a device 310 that may be defined according to a tablet form factor, a "convertible" form factor, etc. As shown, the device 310 includes a processor 311, memory 312, audio circuitry 314, volume circuitry 315, a power button 341, a microphone 342, a rear-facing camera 343, a headphone and/or microphone connector 344, an HDMI connector 345, a USB connector 346, a dock connector 347, a SIM card slot 348, a reset 349, a media card reader 350, a USB connector 351, a speaker 352, a pen/stylus slot 353, a hole 354, a volume control 355, an ambient light sensor 356, a front-facing camera 357, and a multi-touch display 358.

As an example, the device 310 may include wireless circuitry that can receive media broadcast via airwaves, for example, consider radio, television, etc. In such an example, the device 310 may include a radio tuner, a TV tuner, etc. that can receive signals and "decode" signals to render audio, video, etc.

Figure 4:
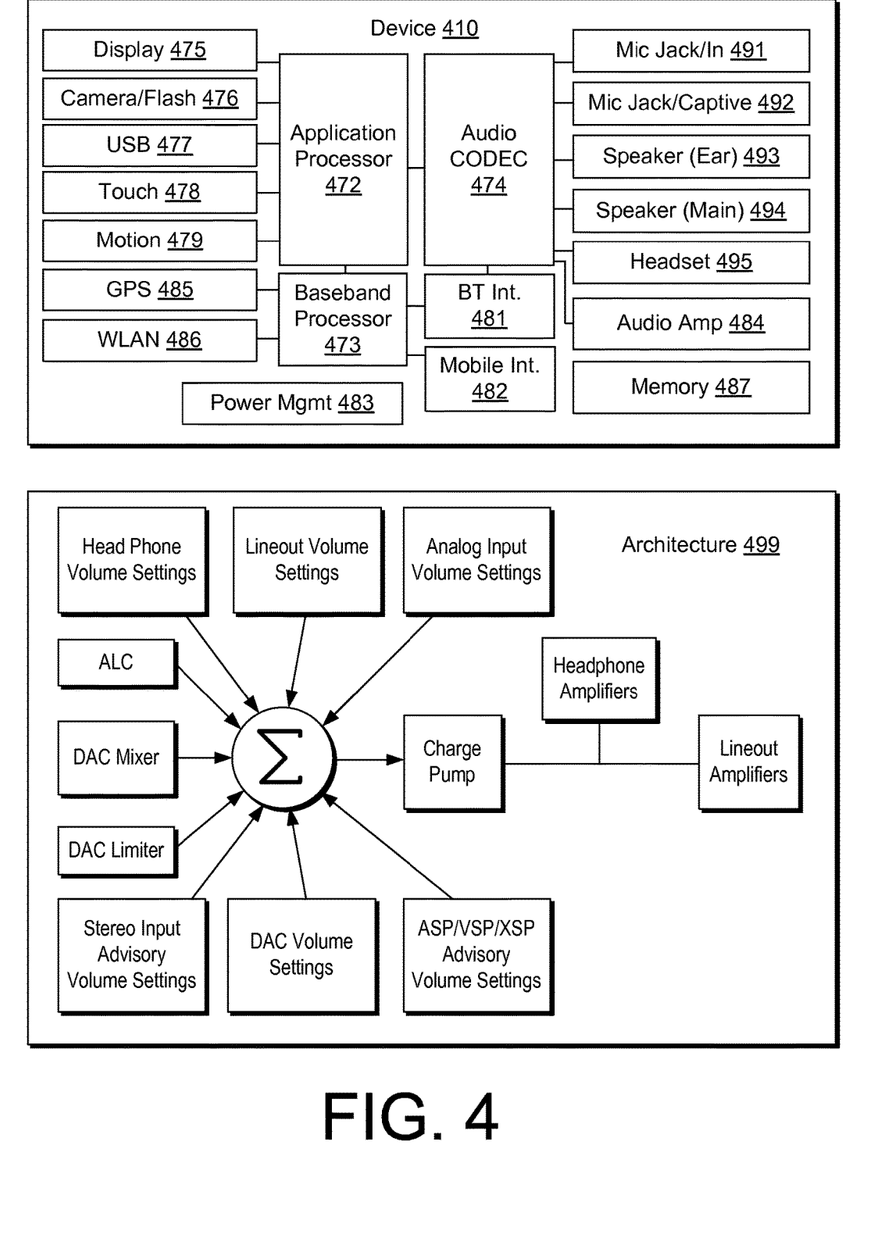
FIG. 4 is a series of diagrams of an example of a device and an example of an architecture.

FIG. 4 shows an example of a device 410 and an example of an architecture 499. As shown in FIG. 4, the device 410 can include an application processor 472, a baseband processor 473, an audio codec 474, a display 475 (e.g., including display driver circuitry), a camera/flash sub-system 476, a USB port 476, touch sensing circuitry 478, motion sensing circuitry 479, BLUETOOTH® circuitry 481, mobile circuitry 482, power management circuitry 483, audio amplification circuitry 484, GPS circuitry 485, WLAN circuitry 486, memory 487, a microphone jack in 491, a captive microphone 492, a captive speaker 493, one or more additional speakers 494, and headset out/circuitry 495. Various types of interfaces may exist between circuitry of a device such as the device 410. As an example, consider an I²S interface, which may, for example, operatively couple the application processor 472 and the audio codec 474; the baseband processor 473 and the audio codec 474; and the BLUETOOTH® circuitry 481 and the audio codec 474.

As an example, the audio codec 474 may include an integrated, low-power smart audio codec that can serve as a mobile audio distribution network incorporating multiple digital/analog converters (DACs) and an ADC, for example, with ground centered headphone, line and speaker amplifiers for smartphone and portable applications. As an example, such an audio codec may include three asynchronous bidirectional serial ports with integrated asynchronous sample rate converters (ASRCs) that may accept a range of incoming audio sample rates, for example, to feed an integrated digital mixing engine. Such an engine may be configured to overlay (e.g., optionally simultaneously) and distribute digital audio from multiple sources to one or more its integrated audio nodes, for example, to provide routeability within an electronic device.

As an example, circuitry can include a digital mixer that can mix and route inputs (e.g., analog inputs to ADC, digital microphone, serial ports, etc.) to outputs (e.g., DAC-fed amplifiers, serial ports, etc.). As an example, a digital mixer may include features for independent attenuation on individual mixer input for individual output. As an example, processing along one or more output paths from a digital mixer to one or more DACs can optionally include volume adjustment and, for example, mute control. As an example, a peak-detector may be implemented to automatically adjust one or more volume levels via a programmable limiter. As an example, circuitry such as audio codec circuitry may be controllable via one or more busses. For example, consider an I²C bus that may be coupled to an I²C interface of audio codec circuitry such that the audio codec circuitry may respond to instructions executed by a processor (e.g., according to one or more applications, etc.). As an example, media player circuitry may include audio codec circuitry. As an example, media player circuitry may include an application executable via a processor that can instruct circuitry such as audio codec circuitry.

As an example, circuitry such as audio codec circuitry may operatively couple with wireless communication circuitry, for example, to communicate audio (e.g., and voice) data to and from components such as, for example, an application processor, a BLUETOOTH® transceiver, a cellphone modem, AIRPLAY™ circuitry (Apple Inc., Cupertino, Calif.), etc.

I²S, also known as Inter-IC Sound, Integrated Interchip Sound, or IIS, is an electrical serial bus interface standard that can be implemented for operatively coupling one or more digital components with respect to audio information. For example, it may be implemented to communicate PCM audio data between integrated circuits in an electronic device. The I²S bus can separate clock and serial data signals, which may result in a lower jitter compared to communications techniques that recover the clock from a data stream.

As an example, a device may include circuitry to implement a ramp up and/or a ramp down to a target volume level. For example, circuitry may include a minimum increment such as about 0.5 dB for changes in volume. In such an example, where a volume control calls for an increase of 10 dB, the circuitry may ramp up that increase over a period of time (e.g., of the order of a second to a few seconds) such that a user perceives a "smooth" transition rather than a 10 dB jump. Such an approach may aim to enhance user experience and, for example, protect audio equipment (e.g., speakers) from a sudden change in energy level.

As an example, the device 410 may implement an architecture such as the architecture 499. The architecture 499 includes a charge pump that can direct audio information to one or more amplifiers. As an example, a volume control may be operatively coupled to one or more components of a device. As an example, a volume control may be operatively coupled to one or more amplifiers of a device. As an example, a volume control may be operatively coupled to one or more pre-amplifiers and/or one or more other types of amplifiers of a device. As an example, a volume control may be operatively coupled to an I²C bus and/or an I²S bus.

Figure 5:
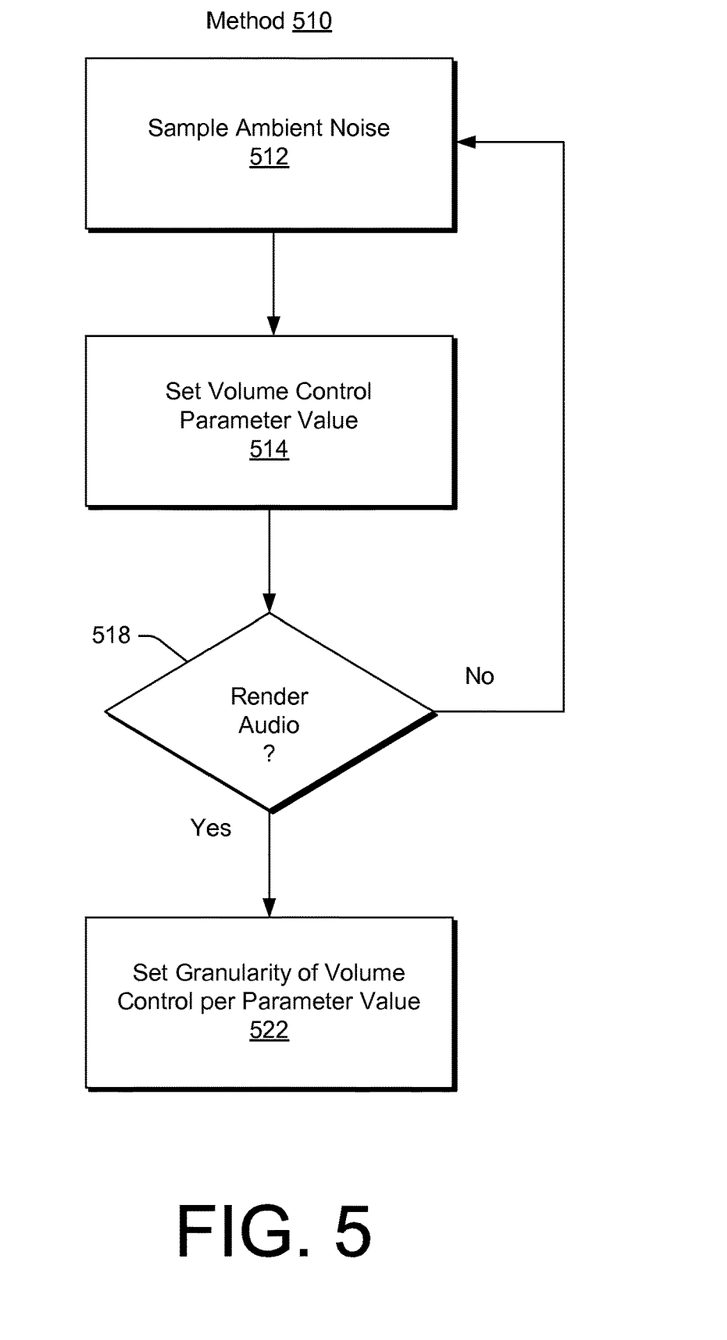
FIG. 5 is a diagram of an example of a method.

FIG. 5 shows an example of a method 510 that includes a sample block 512 for sampling ambient noise, a set block 514 for setting a volume control parameter value, a decision block 518 for deciding to render audio and a set block 522 for setting granularity of a volume control based at least in part on the set volume control parameter value. In such an example, the sampling of the sample block 512 may operate in response to a trigger. For example, a power-on signal of a device may trigger sampling, launching of a media player may trigger sampling, selection of a media file may trigger sampling, launching of a browser may trigger sampling, reception of a broadcast signal may trigger sampling, etc. As shown in the example of FIG. 5, the decision block 518 can decide whether to render audio based on receipt of one or more signals, for example, to continue at the sample block 512 or to continue at the set block 522.

Figure 6:
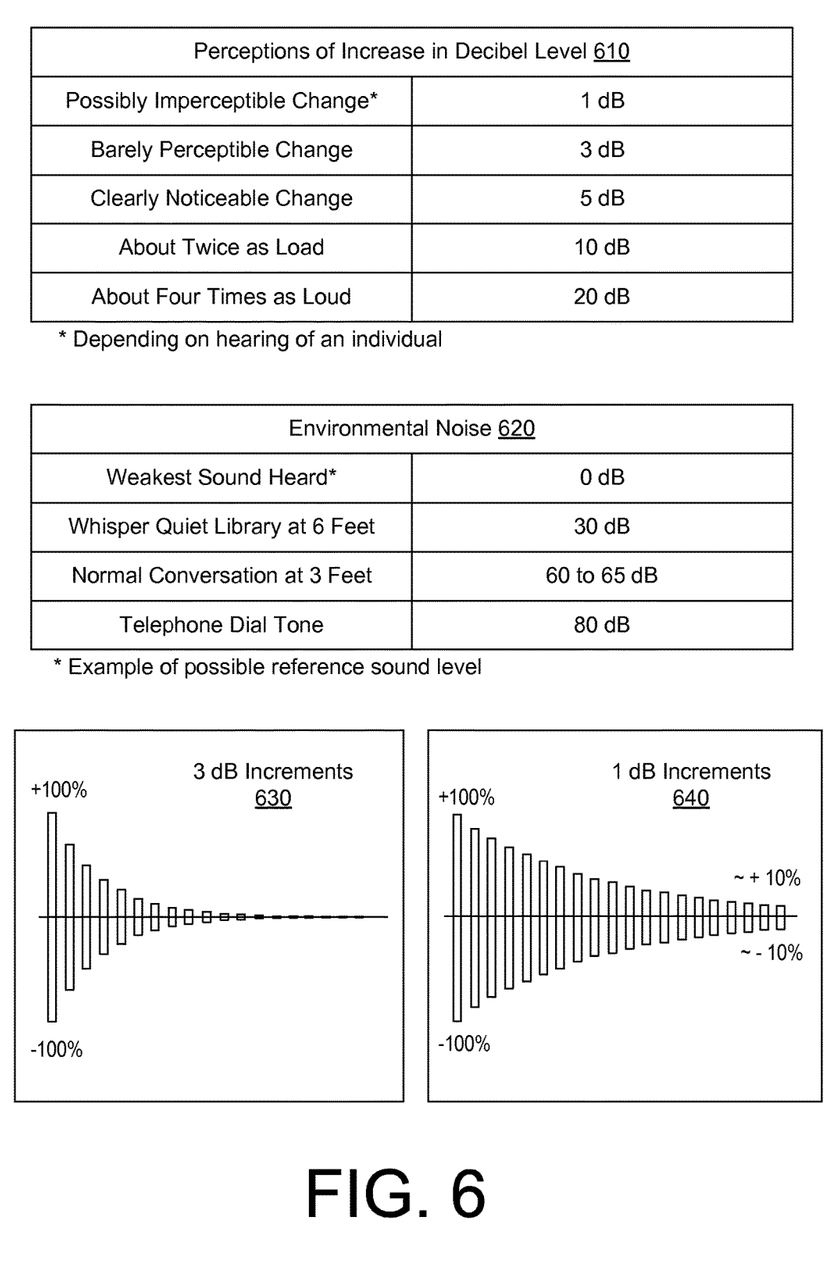
FIG. 6 is a series of tables of examples of sound related information and examples of plots of sound levels versus increment size.

FIG. 6 shows a table 610 of perceptions of increases in decibel (dB) levels, a table 620 of environmental noise in decibels (dB), a plot 630 of sound level decreasing in increments of about 3 dB and a plot 640 of sound level decreasing in increments of about 1 dB. The decibel (dB) can be a logarithmic unit used to express the ratio between two values of a physical quantity such as, for example, power or intensity. One of these quantities may be a reference value, and in this case the decibel may be used to express the absolute level of the physical quantity. The number of decibels is ten times the logarithm to base 10 of the ratio of the two power quantities. One decibel is one tenth of one bell, in honor of Alexander Graham Bell.

In acoustics, the decibel may be a unit of sound pressure, for a reference pressure of 20 micropascals in air (e.g., and 1 micropascal in water). The reference pressure in air can be set at a threshold of perception of an average human. The human ear has a relatively large dynamic range in audio reception. The ratio of the sound intensity that causes permanent damage during short exposure to the quietest sound that the ear can hear is greater than or equal to 1 trillion. As the human ear is not equally sensitive to all sound frequencies, noise levels at maximum human sensitivity, somewhere between 2 and 4 kHz, may be factored more heavily into some measurements using frequency weighting. As an example, 0 dB may be a sound level that occurs when a measured sound level (e.g., sound intensity) is approximately equal to a reference level (e.g., consider a reference sound level corresponding to about 0.02 mPa).

As an example, a volume control may be calibrated with respect to a null setting where volume may be adjusted upward or downward from the null setting. For example, consider a null being labeled "0 dB", which may correspond to X db of output (e.g., at a particular distance from a loudspeaker(s)). In such an example, negative increments may decrease the sound level while positive increments may increase the sound level. For example, a range may be from −40 dB to +40 dB with increments of Y dB. As an example, a range may be asymmetric about a null. As an example, upon startup of a device, audio circuitry, a volume controller, etc., a null point may be implemented about which a range may exist in a positive direction with respect to increasing volume, a negative direction with respect to decreasing volume or positive and negative directions. As an example, a method may include adjusting the granularity of such increments (e.g., in response to an ambient sound level, etc.). As an example, a reference level of sound (e.g., output such as an audio signal output) may be an average value, for example, with peaks and valleys that may extend above the average value and below the average value, respectively.

As shown in the table 610, a perceptible change may be about 3 dB (e.g., possibly at about 1 dB or less, depending on an individual's hearing) and a clearly noticeable change may be about 5 dB. As to the table 620, a whisper in a quiet library at 6 feet (e.g., about 2 meters) may be about 30 dB; whereas, conversation at about 3 feet (e.g., about 1 meter) may be about 60 dB to about 65 dB. As shown in the table 620, 0 dB may be an example of a reference sound level; noting that one or more other sound levels may be implemented as a reference sound level (e.g., 1 dB or other sound level).

As an example, to increase a sound level by about 1 dB, power can be increased by about 26 percent (e.g., voltage by about 12 percent); whereas, to increase a sound level by about 0.3 dB, power can be increased by about 7 percent (e.g., voltage by about 3.5 percent). As an example, for an individual (e.g., or group of individuals), an increment of about 1 dB may be at about a Just Noticeable Difference (JND) for sound level.

As mentioned, the plot 630 shows sound level decreasing in increments of about 3 dB and the plot 640 shows sound level decreasing in increments of about 1 dB. As an example, a method can include adjusting increments such that a curve of incremental decreases or increases versus output sound level may be adjusted. For example, consider adjusting a volume control from a 3 dB increment volume control with incremental changes as shown in the plot 630 to a 1 dB increment volume control with incremental changes as shown in the plot 640. As illustrated, the 1 dB increment allows for more selectable sound levels. In an example that corresponds to the plot 640, a user may be able to achieve a desired sound level whereas in the plot 630, a user may be dissatisfied with a selectable sound level (e.g., as being too loud or too soft).

Figure 7:
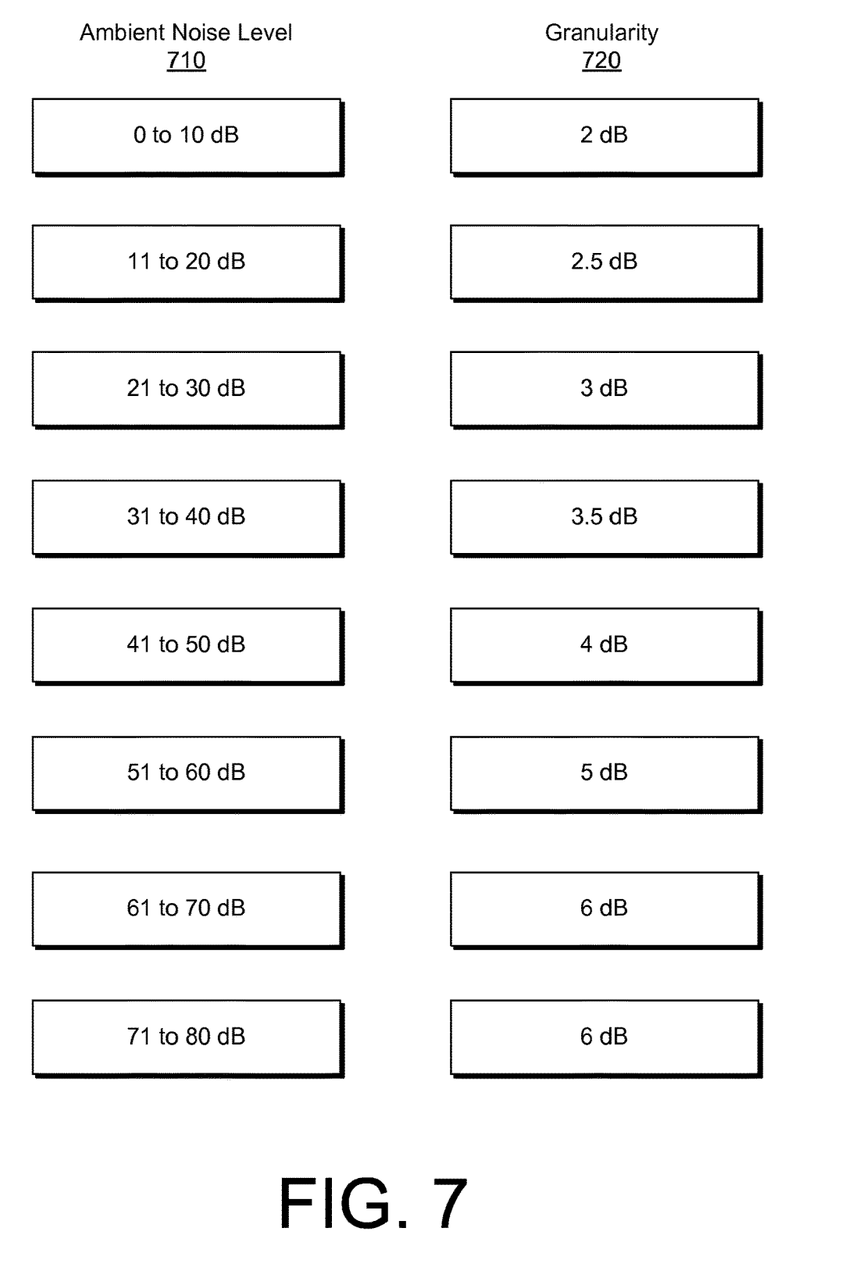
FIG. 7 is a diagram of examples of ambient noise levels and examples of granularities.

FIG. 7 shows an example of ambient noise level 710 and examples of corresponding granularity 720; noting that one or more other granularities may be implemented. As shown, levels of noise may be discretized at about 10 dB and granularity may decrease with respect to increasing level of noise. As an example, for ambient noise levels (e.g., ambient sound levels) below about 30 dB, granularity of a volume control may be about 3 dB or less. As an example, digital audio circuitry (see, e.g., the circuitry of FIG. 4) may provide for increments of about 0.5 dB. As an example, a device may provide for adjustable ramp up and/or ramp down based at least in part on granularity. For example, where granularity is 6 dB, ramp up and/or ramp down may be about 1 dB; whereas, where granularity is 3 dB, ramp up and/or ramp down may be about 0.5 dB.

As an example, ramp up and/or ramp down time may be extended based at least in part on ambient noise level. For example, if a ramp up time is about 2 seconds for a 6 dB change in audio output to a level of about 80 dB, a ramp up time may be about 6 seconds for a 3 dB change in audio output to a level of about 30 dB. In such an example, the extended ramp time can allow a user to "intervene" if the volume appears to be becoming too loud for the environment. For example, during a ramp up, if the volume is becoming too loud, a user may intervene by actuating a volume control to decrease the volume, which may transmit a signal to cut short the ramp up. In such an example, the volume may return to the last volume setting (e.g., increment prior to the increment being interrupted).

Figure 8:
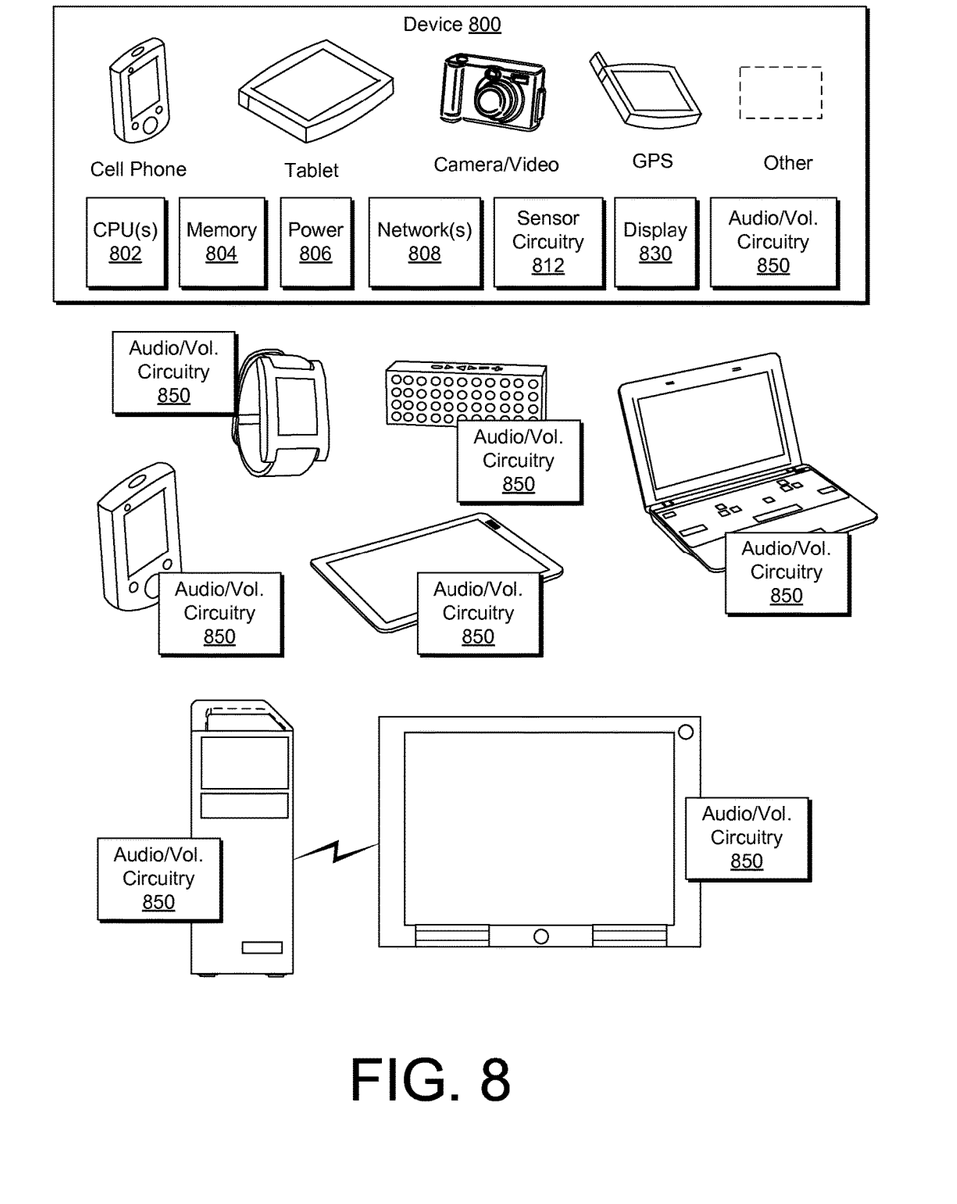
FIG. 8 is a diagram of an example of a device and examples of device configurations.

FIG. 8 shows an example of a device 800 that may include audio and volume circuitry 850. As shown, the device 800 may be configured, for example, as a watch, a wired or a wireless speaker, a phone, a tablet, a notebook, a desktop system, a camera, a GPS device or other device.

As an example, the device 800 may include one or more processors 802, memory 804, a power source 806, one or more network interfaces 808, sensor circuitry 812 (e.g., one or more microphones), a display 830 (e.g., or displays), and audio and volume circuitry 850. As an example, audio and volume circuitry 850 may be operatively coupled to a processor, may include a processor, etc. As an example, the audio and volume circuitry 850 may be configured for processing audio signals and adjusting granularity of a volume control. As an example, the device 800 may include a volume control, which may be a touch-sensitive volume control.

As an example, a device may be a speaker unit that may include acoustic drivers, passive bass radiators, a built-in microphone, an IEEE 1329 Type 1-compliant speakerphone, a stereo input jack, a USB port (e.g., for updating), etc.

As an example, a device can include a processor; memory accessible by the processor; a microphone; an audio signal output; audio circuitry that renders audio signals to the audio signal output; and volume control circuitry that regulates coarseness of increments of a dynamic range of the audio signals responsive to input via the microphone. In such an example, the device can include a speaker operatively coupled to the audio signal output.

As an example, volume control circuitry can increase coarseness of increments of a dynamic range responsive to an increase in sound level sensed by a microphone and/or decrease coarseness of the increments responsive to a decrease in sound level sensed by the microphone.

As an example, a device can include memory that includes an audio file accessible by audio circuitry for rendering as audio signals to an audio signal output.

As an example, a device can include a mechanical movable volume control, which may be, for example, a dual button volume control, a rocker button volume control or other type of mechanical movable volume control. As an example, a device can include a capacitive touch-sensitive volume control.

As an example, a device can include a touch-sensitive display and a graphical user volume control renderable to the display. As an example, a device can include cellular phone circuitry.

As an example, a method can include sensing a level of ambient sound; and, responsive to the sensing, adjusting granularity of a dynamic range of a volume control of audio output that is other than the ambient sound. In such an example, the method may include sensing a higher level of ambient sound and decreasing the granularity and/or sensing a lower level of ambient sound and increasing the granularity.

As an example, a method may include rendering audio signals to a speaker interface where a volume control controls amplitude of the audio signals.

As an example, one or more machine-readable storage media can include processor-executable instructions, the instructions including instructions to: sense a level of ambient sound; and, based at least in part on a sensed level of ambient sound, adjust granularity of a dynamic range of a volume control. In such an example, instructions can include instructions to sense a higher level of ambient sound and decrease the granularity and/or instructions to sense a lower level of ambient sound and increase the granularity.

As an example, one or more machine-readable storage media can include processor-executable instructions to render audio signals to a speaker interface where a volume control controls amplitude of the audio signals.

As an example, one or more machine-readable storage media can include processor-executable instructions to receive broadcast audio signals, render the broadcast audio signals to a speaker interface where a volume control controls amplitude of the broadcast audio signals.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium or a machine-readable medium may be a storage device (e.g., a memory card, a storage disk, etc.) and referred to as a computer-readable storage medium or a machine-readable storage medium that is not a carrier wave (e.g., a non-transitory medium).

Figure 9:
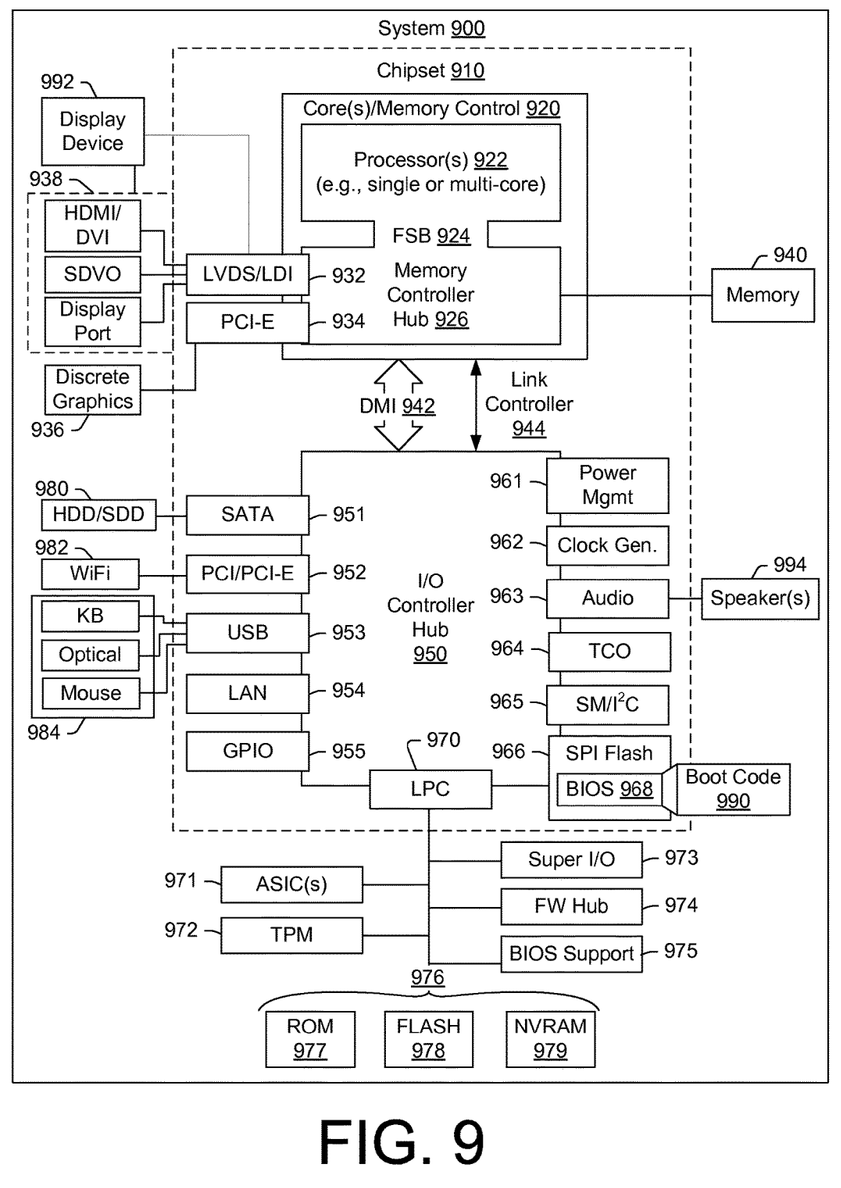
FIG. 9 is a diagram of examples of components.

While various examples of circuits or circuitry have been discussed, FIG. 9 depicts a block diagram of an illustrative computer system 900. As an example, the system 900 may be a system of components that may be included in a device. The system 900 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a satellite, a base, a server or other machine may include other features or only some of the features of the system 900. As described herein, a device (see, e.g., the device 110, the device 310, etc.) may include at least some of the features of the system 900.

As shown in FIG. 9, the system 900 includes a so-called chipset 910. A chipset refers to a group of integrated circuits, or chips, that are designed to work together. Chipsets are usually marketed as a single product (e.g., consider chipsets marketed under the brands INTEL®, AMD®, etc.).

In the example of FIG. 9, the chipset 910 has a particular architecture, which may vary to some extent depending on brand or manufacturer. The architecture of the chipset 910 includes a core and memory control group 920 and an I/O controller hub 950 that exchange information (e.g., data, signals, commands, etc.) via, for example, a direct management interface or direct media interface (DMI) 942 or a link controller 944. In the example of FIG. 9, the DMI 942 is a chip-to-chip interface (sometimes referred to as being a link between a "northbridge" and a "southbridge").

The core and memory control group 920 include one or more processors 922 (e.g., single core or multi-core) and a memory controller hub 926 that exchange information via a front side bus (FSB) 924. As described herein, various components of the core and memory control group 920 may be integrated onto a single processor die, for example, to make a chip that supplants the conventional "northbridge" style architecture. As an example, a chipset may be configured as a platform controller hub (PCH), for example, the memory controller hub (MCH) 926 may be considered a northbridge and the I/O controller hub (ICH) 950 may be considered a southbridge where the MCH 926 and the ICH 950 may be components of the platform controller hub (PCH) (e.g., a PCH architecture).

As shown in FIG. 9, the memory controller hub 926 interfaces with memory 940. For example, the memory controller hub 926 may provide support for DDR SDRAM memory (e.g., DDR, DDR2, DDR3, etc.). In general, the memory 940 is a type of random-access memory (RAM). It is often referred to as "system memory". As an example, one or more processors may include circuitry for memory access, for example, to access system memory.

The memory controller hub 926 further includes a low-voltage differential signaling interface (LVDS) 932. The LVDS 932 may be a so-called LVDS Display Interface (LDI) for support of a display device 992 (e.g., a CRT, a flat panel, a projector, etc.). A block 938 includes some examples of technologies that may be supported via the LVDS interface 932 (e.g., serial digital video, HDMI/DVI, display port). The memory controller hub 926 also includes one or more PCI-express interfaces (PCI-E) 934, for example, for support of discrete graphics 936. Discrete graphics using a PCI-E interface has become an alternative approach to an accelerated graphics port (AGP). For example, the memory controller hub 926 may include a 16-lane (x16) PCI-E port for an external PCI-E-based graphics card. A system may include AGP or PCI-E for support of graphics (e.g., rendering of graphics to a display, etc.).

The I/O controller hub 950 includes a variety of interfaces. The example of FIG. 9 includes a SATA interface 951, one or more PCI-E interfaces 952 (optionally one or more legacy PCI interfaces), one or more USB interfaces 953, a LAN interface 954 (more generally a network interface), a general purpose I/O interface (GPIO) 955, a low-pin count (LPC) interface 970, a power management interface 961, a clock generator interface 962, an audio interface 963 (e.g., for speakers 994), a total cost of operation (TCO) interface 964, a system management bus interface (e.g., a multi-master serial computer bus interface) 965, and a serial peripheral flash memory/controller interface (SPI Flash) 966, which, in the example of FIG. 9, includes BIOS 968 and boot code 990. With respect to network connections, the I/O controller hub 950 may include integrated gigabit Ethernet controller lines multiplexed with a PCI-E interface port. Other network features may operate independent of a PCI-E interface.

The interfaces of the I/O controller hub 950 provide for communication with various devices, networks, etc. For example, the SATA interface 951 provides for reading, writing or reading and writing information on one or more drives 980 such as HDDs, SDDs or a combination thereof. The I/O controller hub 950 may also include an advanced host controller interface (AHCI) to support one or more drives 980. The PCI-E interface 952 allows for wireless connections 982 to devices, networks, etc. The USB interface 953 provides for input devices 984 such as keyboards (KB), one or more optical sensors, a touchpad, mice and various other devices (e.g., cameras, phones, storage, media players, etc.). On or more other types of sensors may optionally rely on the USB interface 953 or another interface (e.g., I²C, etc.).

In the example of FIG. 9, the LPC interface 970 provides for use of one or more ASICs 971, a trusted platform module (TPM) 972, a super I/O 973, a firmware hub 974, BIOS support 975 as well as various types of memory 976 such as ROM 977, Flash 978, and non-volatile RAM (NVRAM) 979. With respect to the TPM 972, this module may be in the form of a chip that can be used to authenticate software and hardware devices. For example, a TPM may be capable of performing platform authentication and may be used to verify that a system seeking access is the expected system.

The system 900, upon power on, may be configured to execute boot code 990 for the BIOS 968, as stored within the SPI Flash 966, and thereafter processes data under the control of one or more operating systems and application software (e.g., stored in system memory 940). An operating system may be stored in any of a variety of locations and accessed, for example, according to instructions of the BIOS 968.

Although examples of methods, devices, systems, etc., have been described in language specific to structural features and/or methodological acts, it is to be understood that the subject matter defined in the appended claims is not necessarily limited to the specific features or acts described.

Rather, the specific features and acts are disclosed as examples of forms of implementing the claimed methods, devices, systems, etc.

What is claimed is:

1. An apparatus comprising:
a processor;
memory accessible by the processor;
a microphone;
an audio signal output;
audio circuitry that renders audio signals to the audio signal output;
a touch-sensitive volume control that comprises a touch-sensitive portion to increase volume incrementally and that comprises another touch-sensitive portion to decrease volume incrementally; and
volume control circuitry that regulates coarseness of increments of a dynamic range of the audio signals responsive to input via the microphone wherein the touch-sensitive volume control is incrementally operable for control of volume based at least in part on the increments and wherein the coarseness of the increments decreases responsive to a decrease in sound amplitude input via the microphone.

2. The apparatus of claim 1 comprising a speaker operatively coupled to the audio signal output.

3. The apparatus of claim 1 wherein the volume control circuitry increases coarseness of the increments responsive to an increase in sound level sensed by the microphone.

4. The apparatus of claim 1 wherein the volume control circuitry decreases coarseness of the increments responsive to a decrease in sound level sensed by the microphone.

5. The apparatus of claim 1 wherein the memory comprises an audio file accessible by the audio circuitry for rendering as audio signals to the audio signal output.

6. The apparatus of claim 1 wherein the touch-sensitive volume control comprises a mechanical movable volume control.

7. The apparatus of claim 6 wherein the touch-sensitive volume control comprises a dual button volume control.

8. The apparatus of claim 6 wherein the touch-sensitive volume control comprises a rocker button volume control.

9. The apparatus of claim 1 wherein the touch-sensitive volume control comprises a capacitive touch-sensitive volume control.

10. The apparatus of claim 1 comprising a touch-sensitive display wherein the volume control comprises a graphical user volume control renderable to the display.

11. The apparatus of claim 1 comprising cellular phone circuitry.

12. A method comprising:
sensing a level of ambient sound; and
responsive to the sensing, adjusting granularity of a dynamic range of a volume control of audio output that is other than the ambient sound wherein the volume control comprises a touch-sensitive volume control that comprises a touch-sensitive portion to increase volume incrementally and that comprises another touch-sensitive portion to decrease volume incrementally and wherein the granularity of the dynamic range of the volume control becomes more granular responsive to a decrease in the level of the ambient sound.

13. The method of claim 12 further comprising sensing a higher level of ambient sound and decreasing the granularity.

14. The method of claim 12 further comprising sensing a lower level of ambient sound and increasing the granularity.

15. The method of claim 12 further comprising rendering audio signals to a speaker interface wherein the volume control controls amplitude of the audio signals.

16. One or more machine-readable storage media comprising processor-executable instructions, the instructions comprising instructions to:
sense a level of ambient sound; and
based at least in part on a sensed level of ambient sound, adjust granularity of a dynamic range of a touch-sensitive volume control that comprises a touch-sensitive portion to increase volume incrementally and that comprises another touch-sensitive portion to decrease volume incrementally and wherein the granularity of the dynamic range of the volume control becomes more granular responsive to a decrease in the level of the ambient sound.

17. The one or more machine-readable storage media of claim 16 comprising processor-executable instructions to: sense a higher level of ambient sound and decrease the granularity.

18. The one or more machine-readable storage media of claim 16 comprising processor-executable instructions to: sense a lower level of ambient sound and increase the granularity.

19. The one or more machine-readable storage media of claim 16 comprising processor-executable instructions to: render audio signals to a speaker interface wherein the volume control controls amplitude of the audio signals.

20. The one or more machine-readable storage media of claim 16 comprising processor-executable instructions to: receive broadcast audio signals, render the broadcast audio signals to a speaker interface wherein the volume control controls amplitude of the broadcast audio signals.

* * * * *